US008962483B2

(12) United States Patent
Woo et al.

(10) Patent No.: US 8,962,483 B2
(45) Date of Patent: Feb. 24, 2015

(54) INTERCONNECTION DESIGNS USING SIDEWALL IMAGE TRANSFER (SIT)

(71) Applicant: GLOBALFOUNDRIES Inc., Grand Cayman (KY)

(72) Inventors: Youngtag Woo, San Ramon, CA (US); Dinesh Somasekhar, Portland, OR (US); Juhan Kim, Santa Clara, CA (US); Yunfei Deng, Sunnyvale, CA (US); Jongwook Kye, Pleasanton, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/799,539

(22) Filed: Mar. 13, 2013

(65) Prior Publication Data
US 2014/0273474 A1 Sep. 18, 2014

(51) Int. Cl.
*H01L 21/3065* (2006.01)
*H01L 21/308* (2006.01)
*G03F 7/26* (2006.01)

(52) U.S. Cl.
CPC ................... *H01L 21/3083* (2013.01)

USPC ............................ 438/694; 438/696; 430/313

(58) Field of Classification Search
None
See application file for complete search history.

(56) References Cited

U.S. PATENT DOCUMENTS

| 2006/0024940 A1* | 2/2006 | Furukawa et al. ............ 438/597 |
| 2007/0048674 A1* | 3/2007 | Wells ............................ 430/313 |
| 2009/0130852 A1* | 5/2009 | Kewley ........................ 438/694 |
| 2013/0196508 A1* | 8/2013 | LiCausi ....................... 438/696 |

* cited by examiner

*Primary Examiner* — Michael Trinh
*Assistant Examiner* — Pamela E Perkins
(74) *Attorney, Agent, or Firm* — Ditthavong & Steiner, P.C.

(57) ABSTRACT

Methodology enabling a generation of an interconnection design utilizing an SIT process is disclosed. Embodiments include: providing a hardmask on a substrate; forming a mandrel layer on the hardmask including: first and second vertical portions extending along a vertical direction and separated by a horizontal distance; and a plurality of horizontal portions extending in a horizontal direction, wherein each of the horizontal portions is positioned between the first and second vertical portions and at a different position along the vertical direction; and forming a spacer layer on outer edges of the mandrel layer.

16 Claims, 12 Drawing Sheets

100

INTERCONNECTION DESIGNS USING SIDEWALL IMAGE TRANSFER (SIT)

TECHNICAL FIELD

The present disclosure relates to a fabrication of features formed utilizing SIT and/or self aligned double patterning (SADP) processes. The present disclosure is particularly applicable to fabrication of 'metal 1' (M1) and 'metal 2' (M2) layers in static random-access memory (SRAM) bitcells utilizing SIT technology for the 14 nanometer (nm) technology node and beyond.

BACKGROUND

In 20 nm technology, features (e.g. metal routes) of interconnection layers (e.g. M1 and above) are generally drawn with 80 to 64 nm pitch, which can be printed utilizing a single or double (e.g., LELE) lithography process. However, in 14 nm technologies, metal routes have a 50 to 45 nm pitch, which cannot be printed by LELE due to overlay tolerance. An SIT process has been utilized to form features (e.g. metal routes) of 14 nm interconnection designs. Such SIT processes frequently enable smaller features and an improved manufacturability of the device. However, features formed utilizing SIT processes frequently have particular restrictions for generation of features.

A need therefore exists for methodology enabling a generation of an interconnection design utilizing an SIT process.

SUMMARY

An aspect of the present disclosure is a method of generating an interconnection design having a stub $V_{SS}$ for an SRAM bitcell by, inter alia, providing a mandrel having first and second vertical portions and a plurality of horizontal portions positioned between the first and second vertical portions.

An aspect of the present disclosure is a method of generating an interconnection design having a lined $V_{SS}$ for an SRAM bitcell by, inter alia, providing a mandrel having first and second vertical portions extending along a vertical direction and a third vertical portion extending along the vertical direction being positioned between the first and second vertical portions, and providing a plurality of block layer portions extending along an entire horizontal width of the third vertical portion.

An aspect of the present disclosure is a method of generating an interconnection design having stub $V_{SS}$ for an SRAM bitcell by, inter alia, providing a mandrel having first and second vertical portions and third and fourth vertical portions being positioned between the first and second vertical portions and a plurality of block layer portions extending between the third and fourth vertical portions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a hardmask on a substrate; forming a mandrel layer on the hardmask including: first and second vertical portions extending along a vertical direction and separated by a horizontal distance; and a plurality of horizontal portions extending in a horizontal direction, wherein each of the horizontal portions is positioned between the first and second vertical portions and at a different position along the vertical direction; and forming a spacer layer on outer edges of the mandrel layer.

Some aspects include providing first and second block layers on the hardmask extending along the vertical direction and positioned between the first and second vertical portions, the first and second block layers being separated from each other; and etching the substrate, forming recesses, the first and second block layers preventing one or more portions of the substrate from being etched. Further aspects include a method, wherein the horizontal portions span the horizontal distance, the method further including: providing the first and second block layers on the substrate adjacent to the first and second vertical portions, respectively; providing a first bitline adjacent to the first block mask and separated from a region between the first and second block masks; and providing a second bitline adjacent to the second block mask and separated from a region between the first and second block masks. Additional aspects include a method, wherein the horizontal portions are separated from the each of the vertical portions and positioned between the first and second block masks, the method further including: providing a first bitline between the first vertical portion and the first block mask; and providing second bitline between the second vertical portion and the second block mask. Some aspects include: providing a plurality of wordlines between the first and second block masks; and providing a plurality of $V_{SS}$ regions between the first and second block masks, wherein one of the horizontal portions is positioned on one of the $V_{SS}$ regions separating two of the wordlines and/or one of the horizontal portions is positioned on one of the wordlines separating another one of the wordlines from one of the $V_{SS}$ regions. Further aspects include providing a $V_{CC}$ region separated by the spacer layer on a side of each of the first and second vertical portions, the $V_{CC}$ regions being outside a region between the first and second portions. Additional aspects include a method, wherein the mandrel layer on the substrate further includes: third and fourth vertical portions extending along the vertical direction and separated by the horizontal distance; and a plurality of second horizontal portions extending in the horizontal direction and spanning the horizontal distance, wherein each of the second horizontal portions is positioned between the third and fourth vertical portions and at a different position along the vertical direction. Some aspects include providing M1 or M2 routes for a SRAM bitcell in the recesses formed by the etching.

Another aspect of the present disclosure is a method including: providing a hardmask on a substrate; forming a mandrel layer on the hardmask including: first and second vertical portions extending along a vertical direction; and a third vertical portion extending along the vertical direction being positioned between the first and second vertical portions and separated from the first and second vertical portions; forming a spacer layer on outer edges of the mandrel layer; and providing a plurality of block layer portions extending in a horizontal direction and separated from the first and second vertical portions, wherein each of the block layer portions extends along an entire horizontal width of the third vertical portion and is at a different position along the vertical direction.

Aspects include etching the substrate, the block layer portions preventing portions of the substrate layer from being etched. Further aspects include providing first and second bitlines on the substrate, the first and second vertical portions being provided on the first and second bitlines, respectively.

Additional aspects include providing a plurality of wordlines on the substrate, the third vertical portion being provided on the wordlines, each adjacent pair of the wordlines being separated by one of the block layer portions. Some aspects include: providing first and second $V_{SS}$ regions between the first and third vertical portions and between the second and third vertical portions, respectively; and providing a $V_{CC}$ region separated by the spacer layer from a side of each of the first and second vertical portions, the $V_{CC}$ regions being outside a region between the first and second portions. Further aspects include a method, wherein the mandrel layer further includes: fourth and fifth vertical portions extending along the vertical direction; and a sixth vertical portion extending along the vertical direction being positioned between the fourth and fifth vertical portions and separated from the fourth and fifth vertical portions, the method further including: providing a plurality of second block layer portions extending in the horizontal direction and separated from the fourth and fifth vertical portions, wherein each of the second block layer portions extends along an entire horizontal width of the sixth vertical portion and at a different position along the vertical direction.

Another aspect of the present disclosure is a method including: providing a hardmask on a substrate; forming a mandrel layer on the hardmask including: first and second vertical portions extending along a vertical direction; and third and fourth vertical portions extending along the vertical direction being positioned between the first and second vertical portions and each being separated from the first and second vertical portions; forming a spacer layer on outer edges of the mandrel layer; and providing a plurality of block layer portions extending in a horizontal direction and between the third and fourth vertical portions, wherein each of the block layer portions extends along an entire horizontal separation distance between spacers at outer edges of the third and fourth vertical portions and is at a different position along the vertical direction.

Aspects include etching the substrate, the block mask portions preventing portions of the substrate layer from being etched. Some aspects include: providing a first bitline between the first and third vertical portions; and providing a second bitline between the second and fourth vertical portions. Further aspects include providing a plurality of wordlines between the third and fourth vertical portions, each adjacent pair of the wordlines being separated by one of the block layer portions. Additional aspects include: providing first and second $V_{SS}$ regions on the substrate, wherein the third and fourth vertical portions are provided on the first and second $V_{SS}$ regions, respectively; and providing a $V_{CC}$ region on the spacer layer on a side of each of the first and second vertical portions, the $V_{CC}$ regions being outside a region between the first and second portions. Further aspects include a method, wherein the mandrel layer further includes: fifth and sixth vertical portions extending along the vertical direction; and seventh and eighth portions extending along the vertical direction being positioned between the fifth and sixth vertical portions and each being separated from the fifth and sixth vertical portions, the method further including: a plurality of second block layer portions extending in the horizontal direction and between the seventh and eighth vertical portions, wherein each of the second block layer portions extends along an entire horizontal separation distance between the seventh and eighth vertical portions and is at a different position along the vertical direction.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of generating an interconnection design (e.g., M1 and above) utilizing an SIT process. In accordance with embodiments of the present disclosure, a mandrel is provided having first and second vertical portions and a plurality of horizontal portions positioned between the first and second vertical portions. Additionally, or alternatively, a mandrel is provided having first and second vertical portions extending along a vertical direction and a third vertical portion extending along the vertical direction being positioned between the first and second vertical portions, and a plurality of block layer portions are provided extending along an entire horizontal width of the third vertical portion. Additionally, or alternatively, a mandrel is provided having first and second vertical portions and third and fourth vertical portions being positioned between the first and second vertical portions and a plurality of block layer portions are provided extending between the third and fourth vertical portions.

Methodology in accordance with embodiments of the present disclosure includes: providing a hardmask on a substrate; forming a mandrel layer on the hardmask including: first and second vertical portions extending along a vertical direction and separated by a horizontal distance; and a plurality of horizontal portions extending in a horizontal direction, wherein each of the horizontal portions is positioned between the first and second vertical portions and at a different position along the vertical direction; and forming a spacer layer on outer edges of the mandrel layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
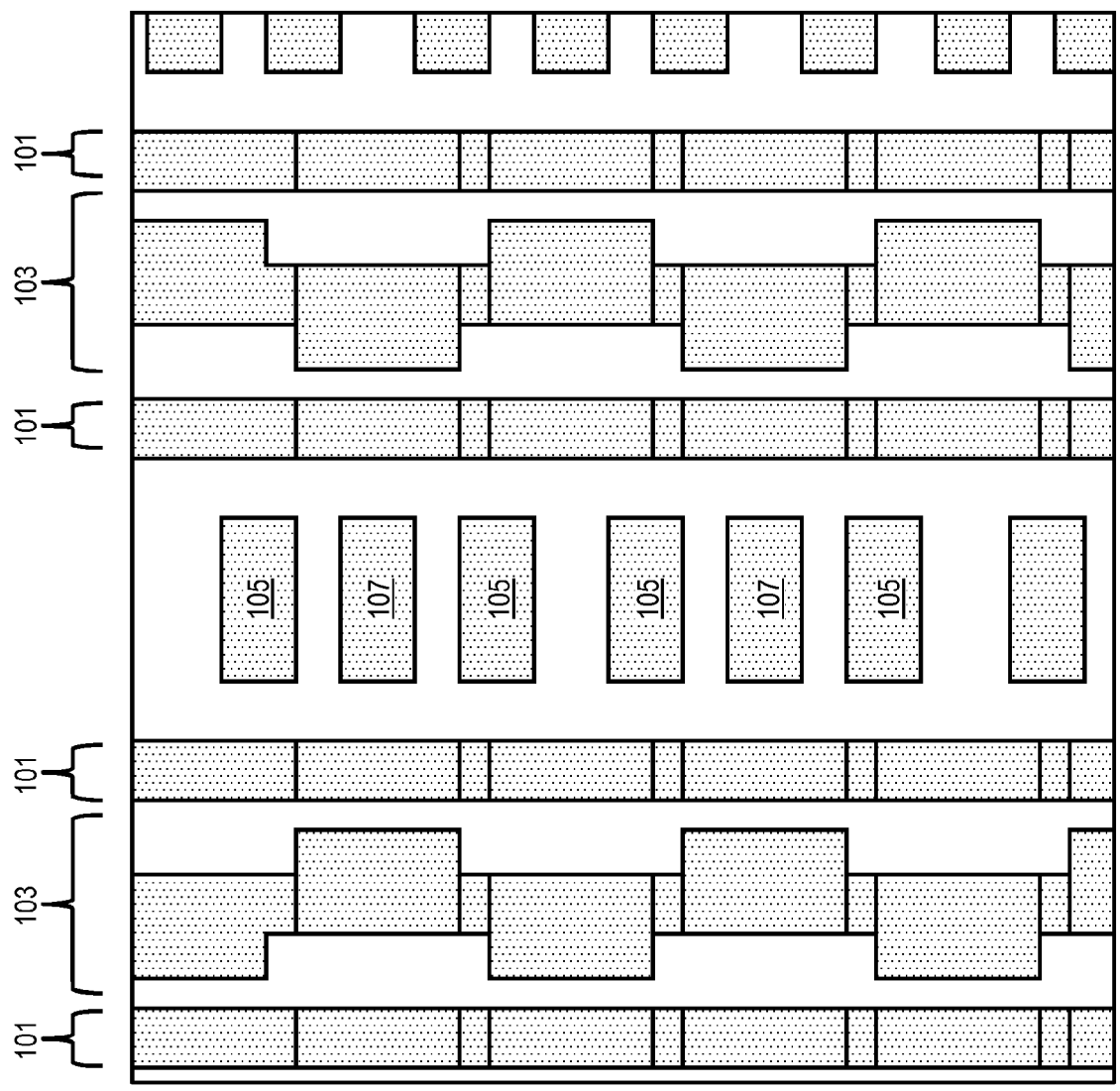
FIG. 1A illustrates exemplary features in an M1 layer of an interconnection design utilizing a lithography process.
Figure 1B:
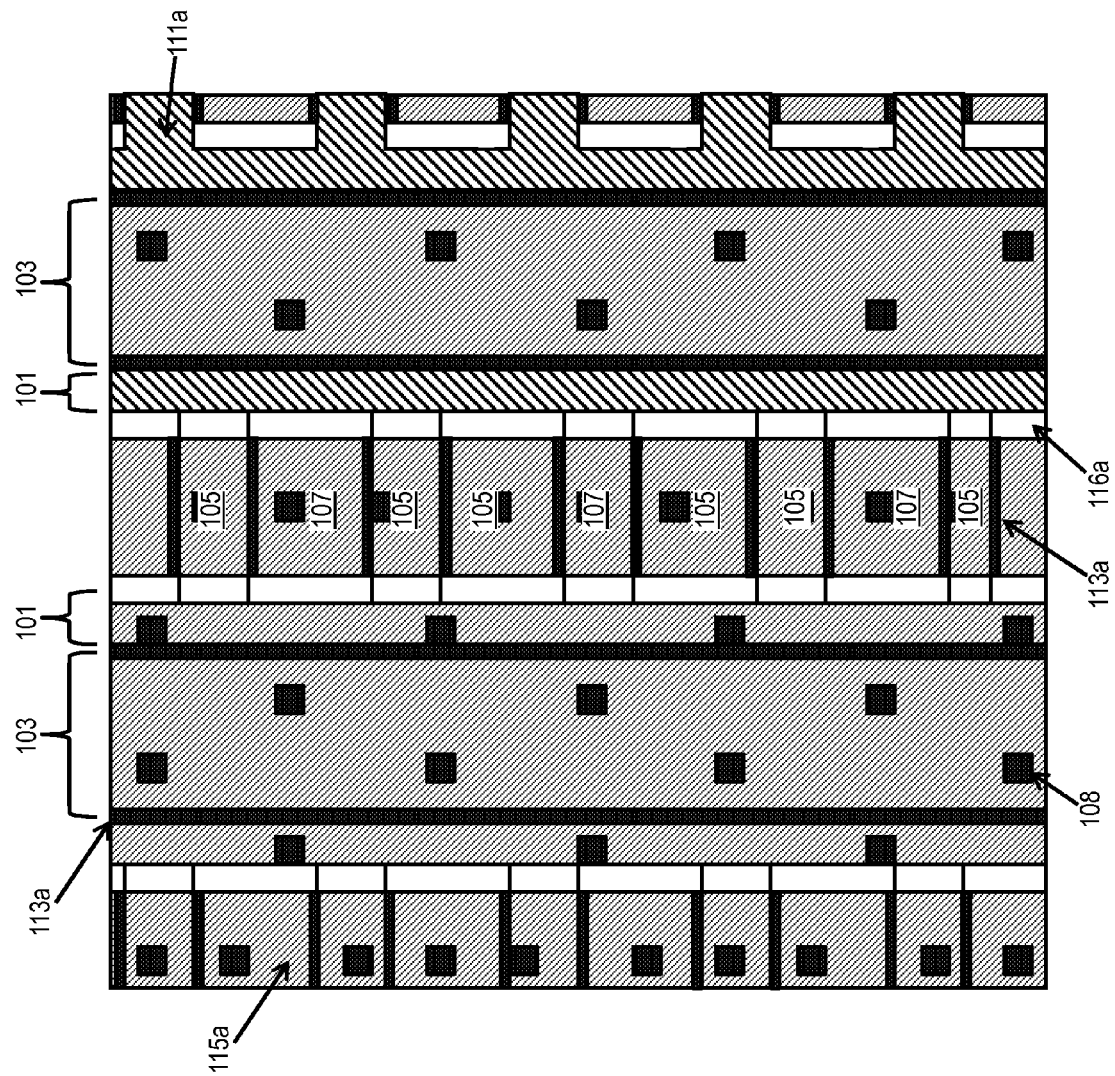
FIGS. 1B and 1C illustrate features corresponding to the exemplary features of FIG. 1A utilizing a SIT process in accordance with exemplary embodiments.
Figure 1C:
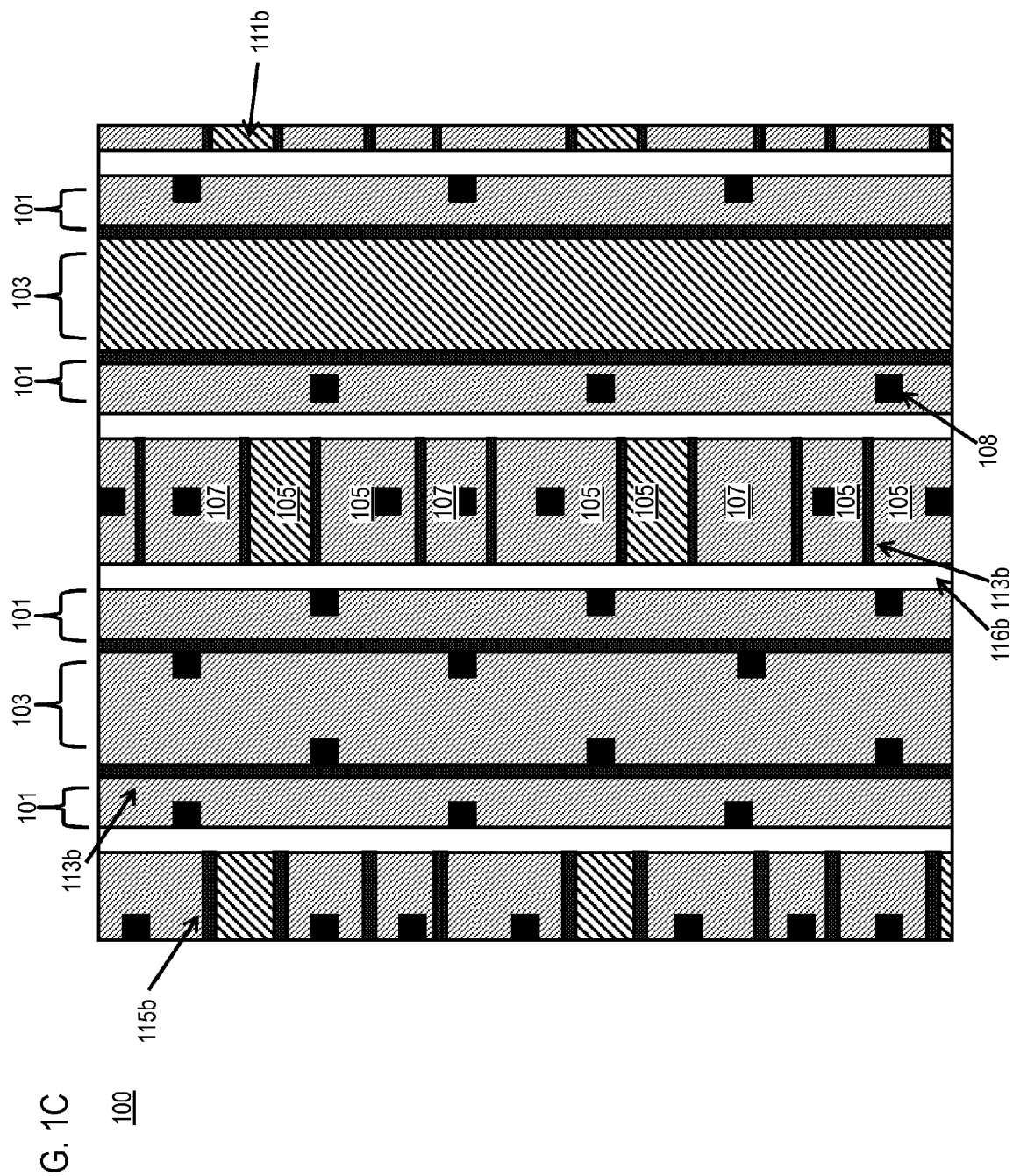

FIGS. 1A, 1B, and 1C include bitlines 101, $V_{CC}$ regions 103, wordlines 105, and $V_{SS}$ regions 107. FIGS. 1B and 1C additionally illustrate contacts 108. As shown, in FIG. 1A the features (e.g., 101-107) include routing for bitlines (e.g., bitlines 101) and are generated in an M1 layer 100 utilizing a double or triple exposure process (e.g., LELE, LELELE). $V_{SS}$ routing may be performed in the M2 layer using $V_{SS}$ stubs (e.g. $V_{SS}$ regions 107) in the M1 layer.

FIG. 1B illustrates a first embodiment of generating the features of FIG. 1A utilizing a SIT (or SADP) process. Adverting to FIG. 1B, a mandrel layer 111a has first and second vertical portions positioned on an adjacent pair of bitlines 101 and horizontal portions positioned on either one of the $V_{SS}$ regions 107 separating two of the wordlines 105 or on one of the wordlines 105 separating another one of the wordlines 105 from one of the $V_{SS}$ regions 107. The SIT process results in spacers 113a being formed on outer edges of the mandrel layer 111a. Additionally, FIG. 1B illustrates a keep mask 115a with openings indicating a block mask 116a adjacent to the first and second vertical portions of the mandrel layer 111a. According to the SIT process, the mandrels are removed, and recesses are formed thereunder as well as between spacers, and metal routes are formed in the recesses. Thus, the SIT process results in metal routes being formed at portions that are covered by keep mask 115a (e.g., not covered by a block mask) and at portions previously covered by the mandrel layer 111a (and not covered by a block mask) and between spacers 113a. Accordingly, the mandrel layer 111a, spacers 113a, and keep mask 115a result in the features of FIG. 1A.

FIG. 1C illustrates a second embodiment of generating the features of FIG. 1A utilizing a SIT (or SADP) process. Adverting to FIG. 1C, a mandrel layer 111b has first and second vertical portions positioned on an adjacent pair of $V_{CC}$ regions 103 and a plurality of horizontal portions positioned on either one of the VSS regions 107 separating two of the wordlines 105 or on one of the wordlines 105 separating another one of the wordlines 105 from one of the $V_{SS}$ regions 107. Additionally, FIG. 1C illustrates a keep mask 115b with openings indicating a block mask 116b having first and second vertical portions separating each of the wordlines 105 from the bitlines 101 and each of the $V_{SS}$ regions 107 from the bitlines 101. As such, the SIT process with the mandrel layer 111b, spacers 113b, and keep mask 115b results in the features of FIG. 1A.

Figure 2A:
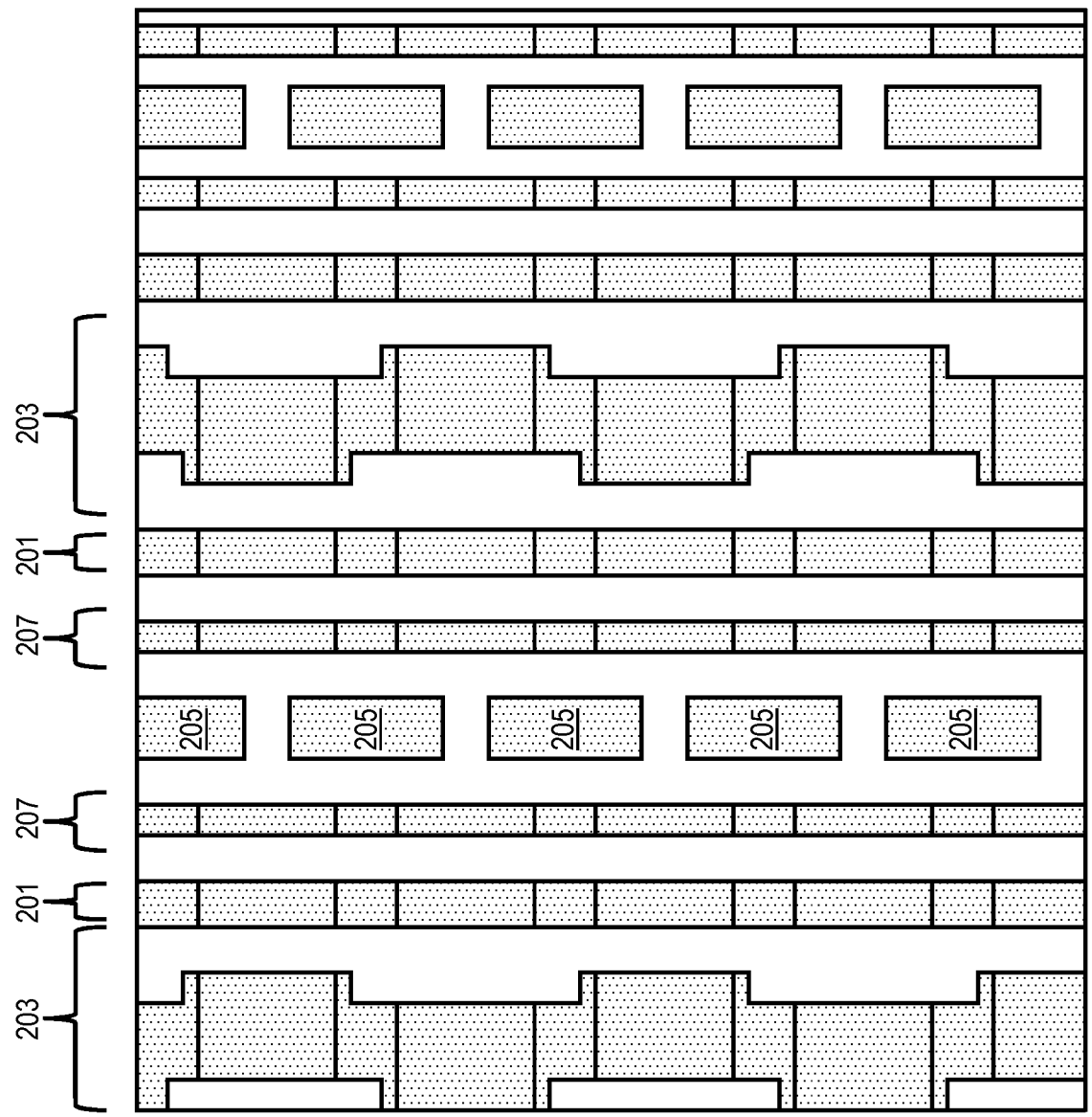
FIG. 2A illustrates exemplary features in an M1 layer of an interconnection design utilizing a lithography process.
Figure 2B:
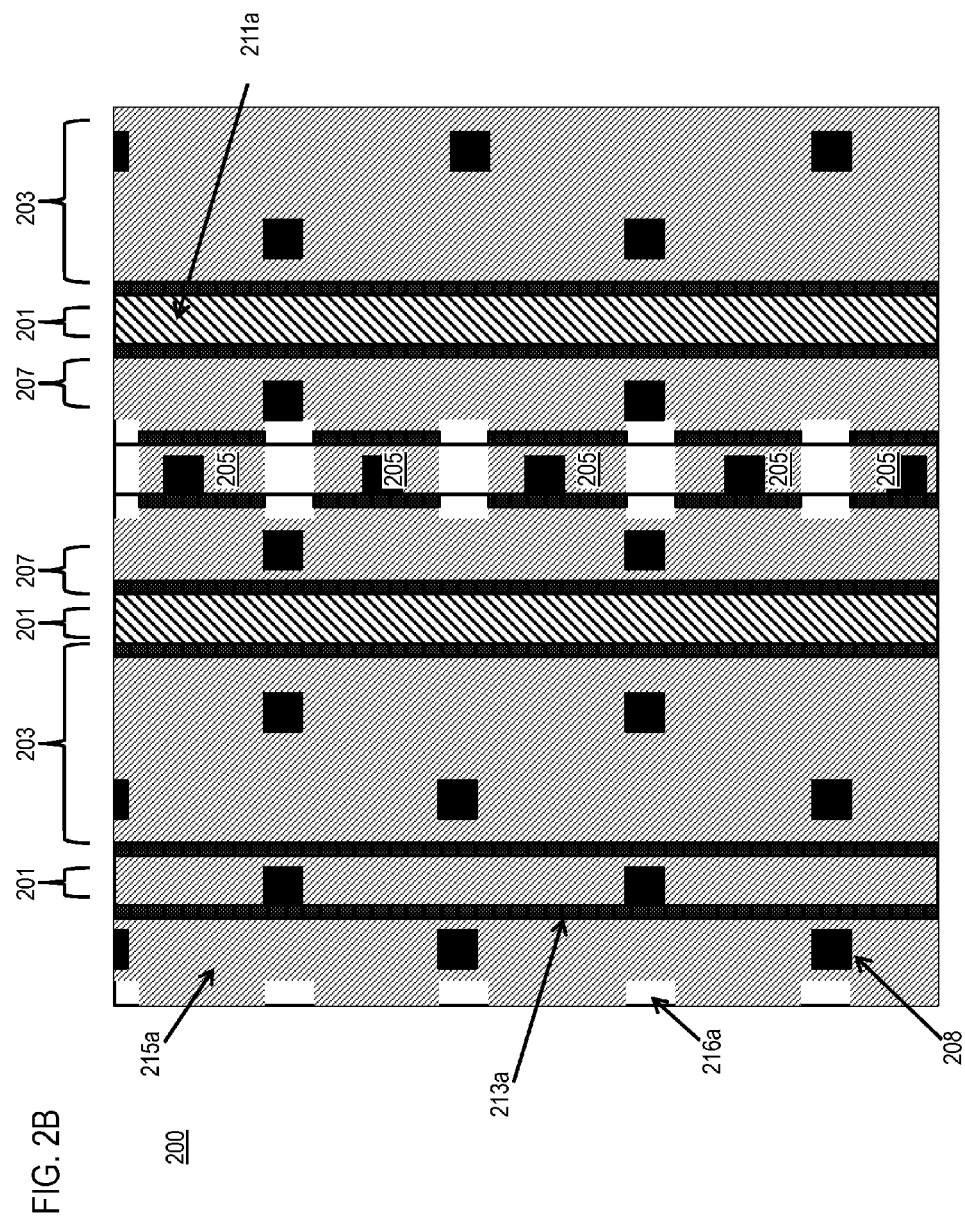
FIGS. 2B and 2C illustrate features corresponding to the exemplary features of FIG. 2A utilizing a SIT process in accordance with exemplary embodiments.
Figure 2C:
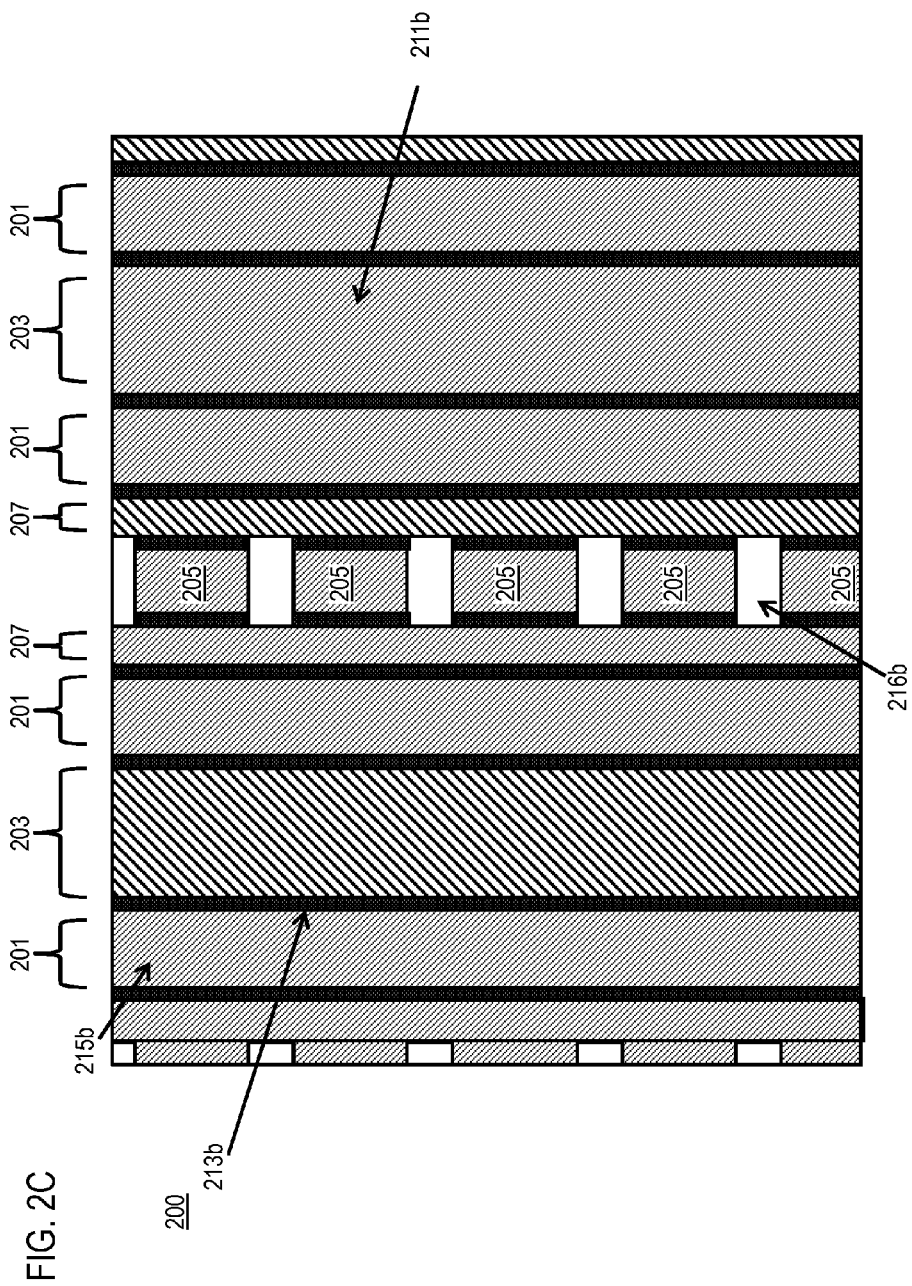

FIGS. 2A, 2B, and 2C include bitlines 201, $V_{CC}$ regions 203, wordlines 205, and $V_{SS}$ regions 207. FIG. 2B additionally illustrates contacts 208. As shown, in FIG. 2A the features (e.g., 201-207) include routing for bitlines (e.g., bitlines 201) and $V_{SS}$ routing (e.g., $V_{SS}$ regions 207) and are generated in an M1 layer 200 utilizing a double or triple exposure process (e.g., LELE, LELELE).

FIG. 2B illustrates a first embodiment of generating the features of FIG. 2A utilizing a SIT (or SADP) process. Adverting to FIG. 2B, a mandrel layer 211a has first and second vertical portions positioned on an adjacent pair of bitlines 201 and a third vertical portion positioned on wordlines 205. The SIT process results in spacers 213a being formed on outer edges of the mandrel layer. Additionally, FIG. 2B illustrates a keep mask 215a with openings indicating a block mask 216a having horizontal portions, each horizontal portion separating an adjacent pair of wordlines 205. As such, the SIT process with the mandrel layer 211a, spacers 213a, and keep mask 215a results in the features of FIG. 2A.

FIG. 2C illustrates a second embodiment of generating the features of FIG. 2A utilizing a SIT (or SADP) process. Adverting to FIG. 2C, a mandrel layer 211b has first and second vertical portions positioned on an adjacent pair of $V_{CC}$ regions 203 and third and fourth vertical portions positioned on an adjacent pair of $V_{SS}$ regions 207. Additionally, FIG. 2C illustrates a keep mask 215b with openings indicating a block mask 216b having horizontal portions, each horizontal portion separating an adjacent pair of wordlines 205. As such, the SIT process with the mandrel layer 211b, spacers 213b, and keep mask 215b results in the features of FIG. 2A.

Figure 3A:
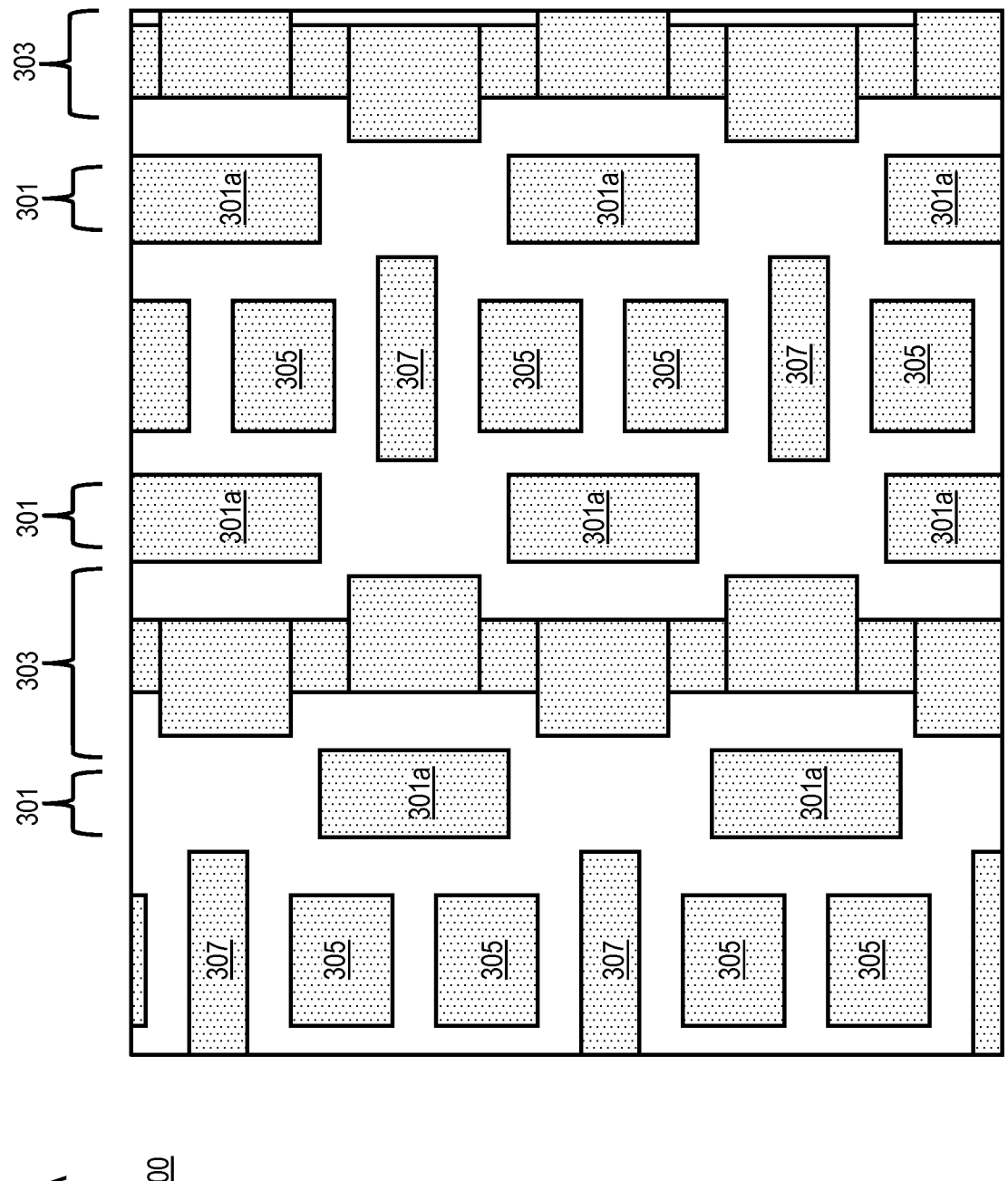
FIG. 3A illustrates exemplary features in an M1 layer of an interconnection design utilizing a lithography process.
Figure 3B:
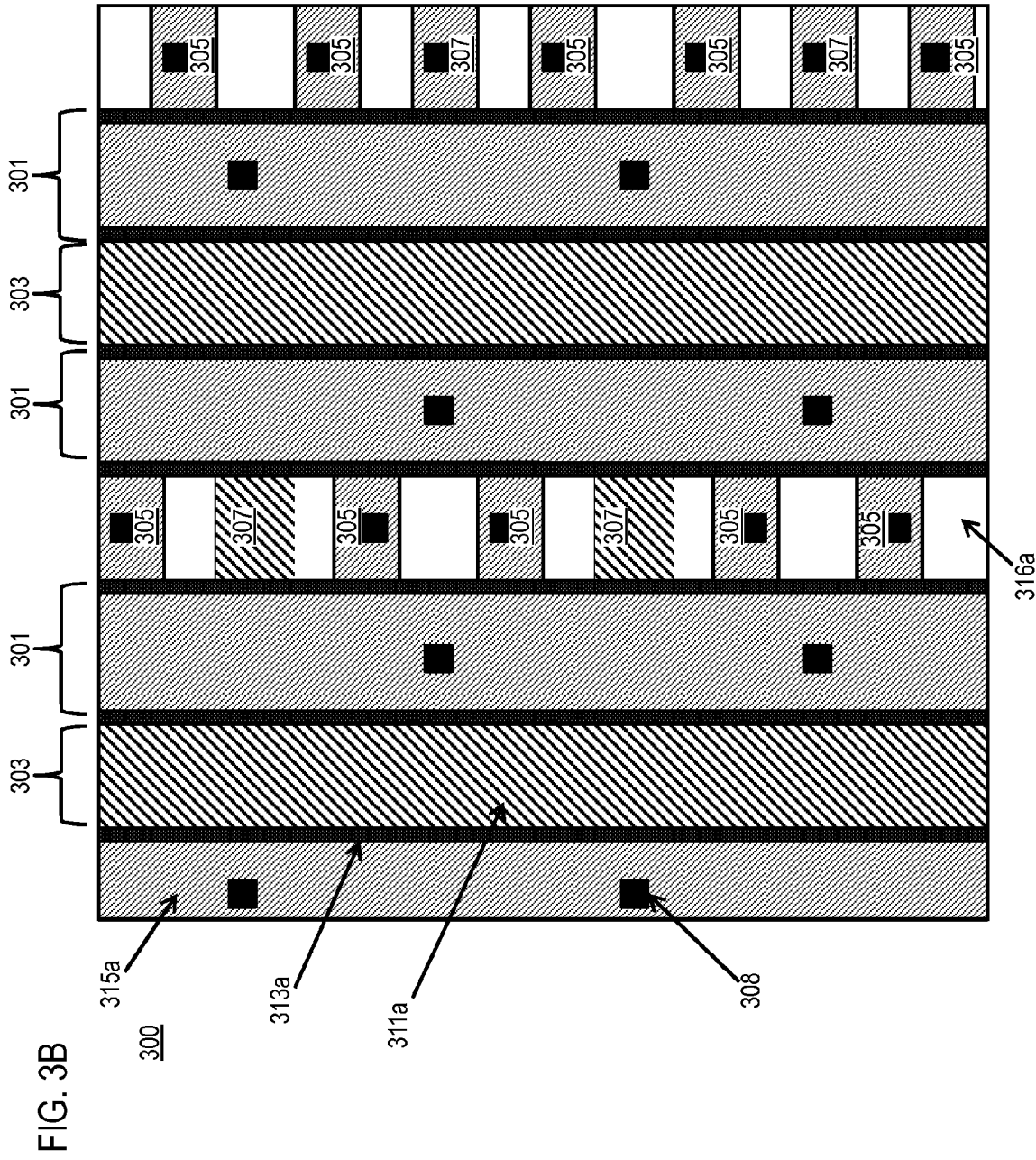
FIGS. 3B and 3C illustrate features corresponding to the exemplary features of FIG. 3A utilizing a SIT process in accordance with exemplary embodiments.
Figure 3C:
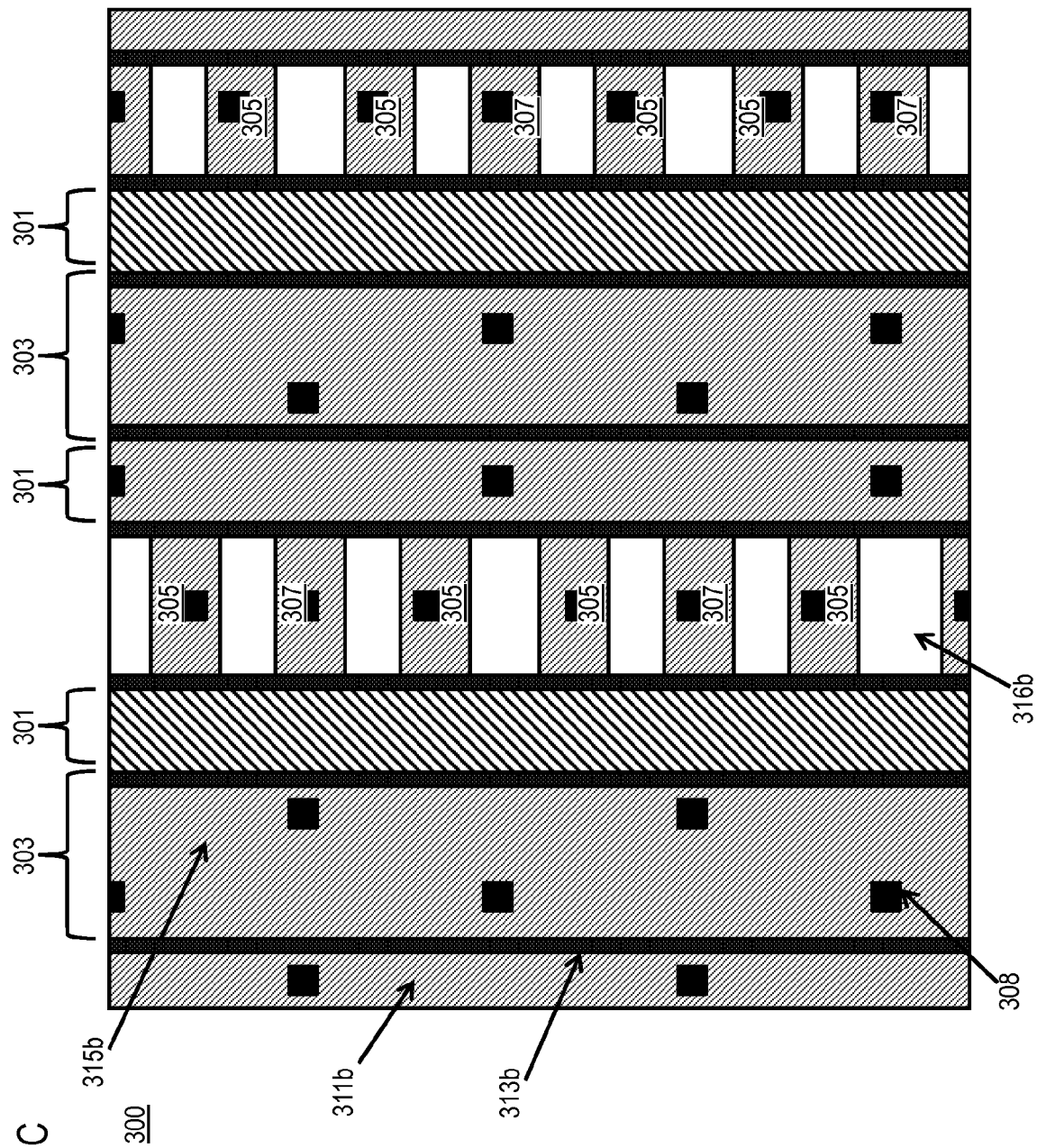

FIGS. 3A, 3B, and 3C include bitlines 301, bitline stubs 301a, $V_{CC}$ regions 303, wordlines 305, and $V_{SS}$ regions 307. FIGS. 3B and 3C additionally illustrate contacts 308. As shown, in FIG. 3A the features (e.g., 301a-307) are generated in an M1 layer 300 utilizing a double or triple exposure process (e.g., LELE, LELELE). $V_{SS}$ and bitline routing may be performed in the M2 layer (not shown) using $V_{SS}$ stubs (e.g. $V_{SS}$ regions 307) and bitline stubs (e.g., bitline stubs 301a) in the M1 layer.

FIG. 3B illustrates a first embodiment of generating the features of FIG. 3A utilizing a SIT (or SADP) process. Adverting to FIG. 3B, a mandrel layer 311a has first and second vertical portions positioned on an adjacent pair of $V_{CC}$ regions 303 and a third vertical portion positioned on wordlines 305 and $V_{SS}$ regions 307. The SIT process results in spacers 313a being formed on outer edges of the mandrel layer. Additionally, FIG. 3B illustrates a keep mask 315a with openings indicating a block mask 316a having horizontal portions, each horizontal portion separating an adjacent pair of wordlines 305 or one of the wordlines 305 from an adjacent one of the $V_{SS}$ regions 307. As such, the SIT process with the mandrel layer 311a, spacers 313a, and keep mask 315a results in the features of FIG. 3A except with the bitline routing being performed in the M1 layer (e.g., bitlines 301), rather than in the M2 layer with bitline stubs 301a in the M1 layer.

FIG. 3C illustrates a second embodiment of generating the features of FIG. 3A utilizing a SIT (or SADP) process. Adverting to FIG. 3C, a mandrel layer 311b has first and second vertical portions positioned on an adjacent pair of bitlines 301. Additionally, FIG. 3C illustrates a keep mask 315b with openings indicating a block mask 316b horizontal portions, each horizontal portion being between the first and second vertical portions and separating an adjacent pair of wordlines 305 or one of the wordlines 305 from an adjacent one of the $V_{SS}$ regions 307. As such, the SIT process with the mandrel layer 311b, spacers 313b, and keep mask 315b results in the features of FIG. 3A except with the bitline routing being performed in the M1 layer (e.g., bitlines 301).

Figure 4A:
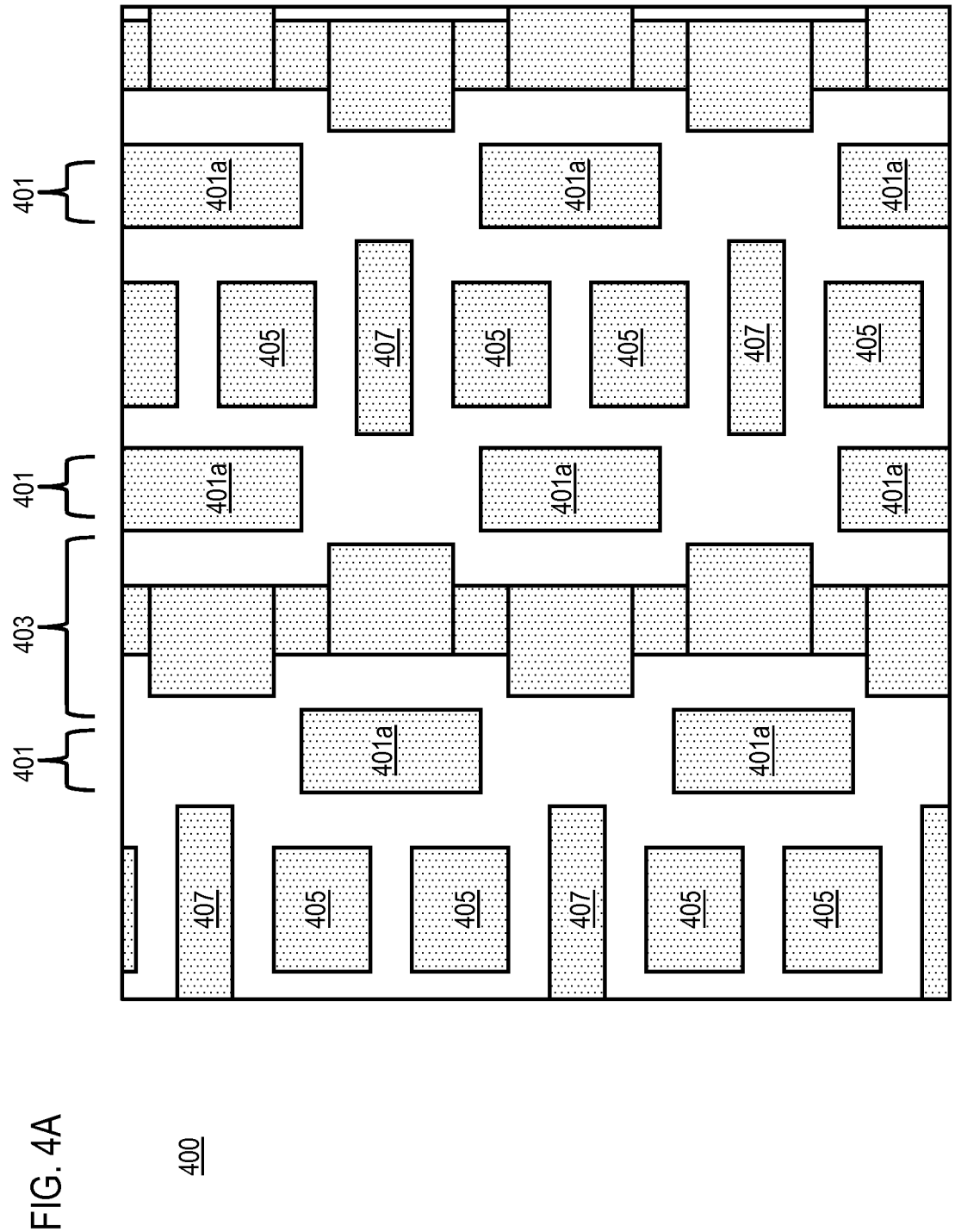
FIG. 4A illustrates exemplary features in an M1 layer of an interconnection design utilizing a lithography process.
Figure 4B:
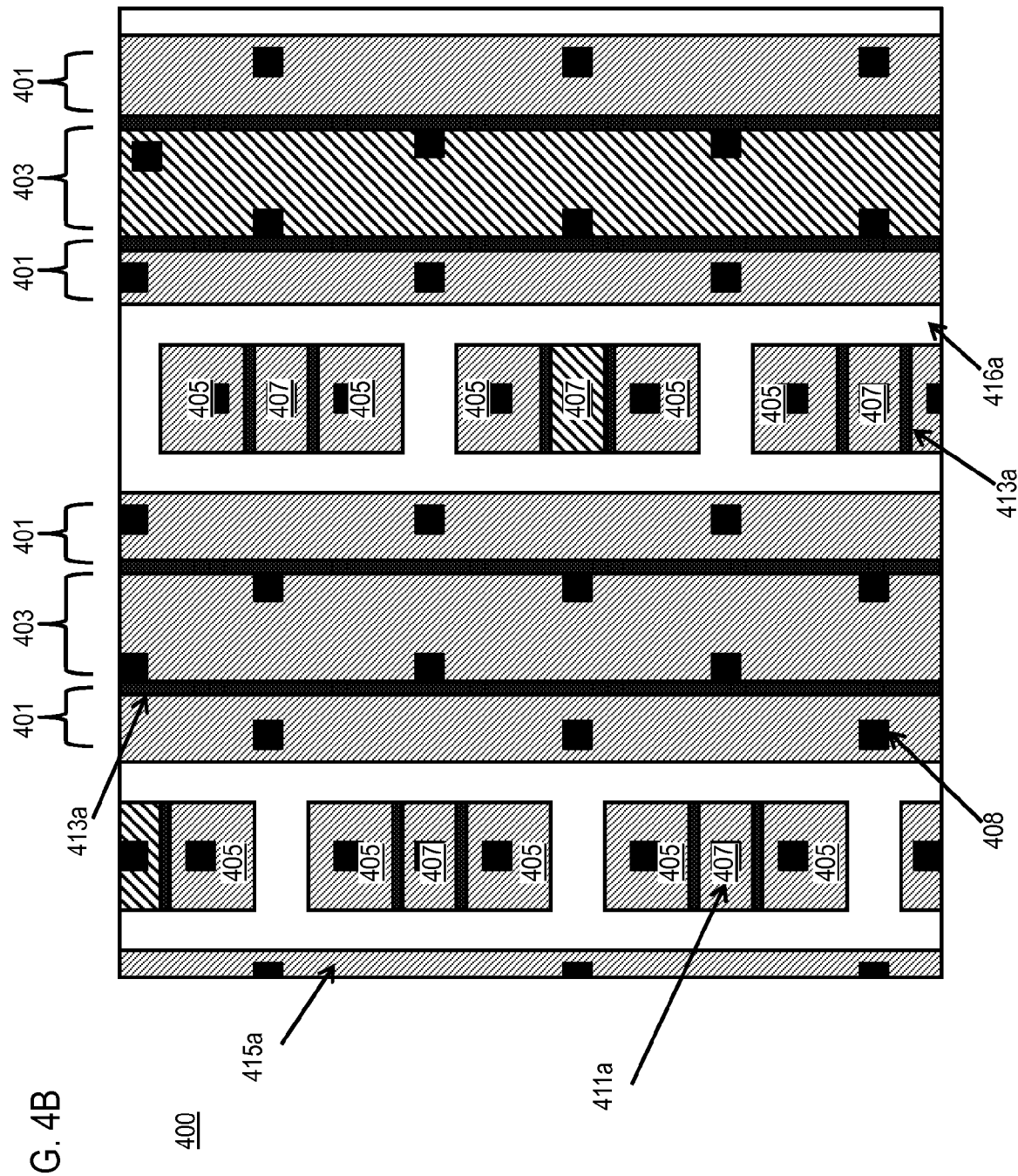
FIGS. 4B and 4C illustrate features corresponding to the exemplary features of FIG. 4A utilizing a SIT process in accordance with exemplary embodiments.
Figure 4C:
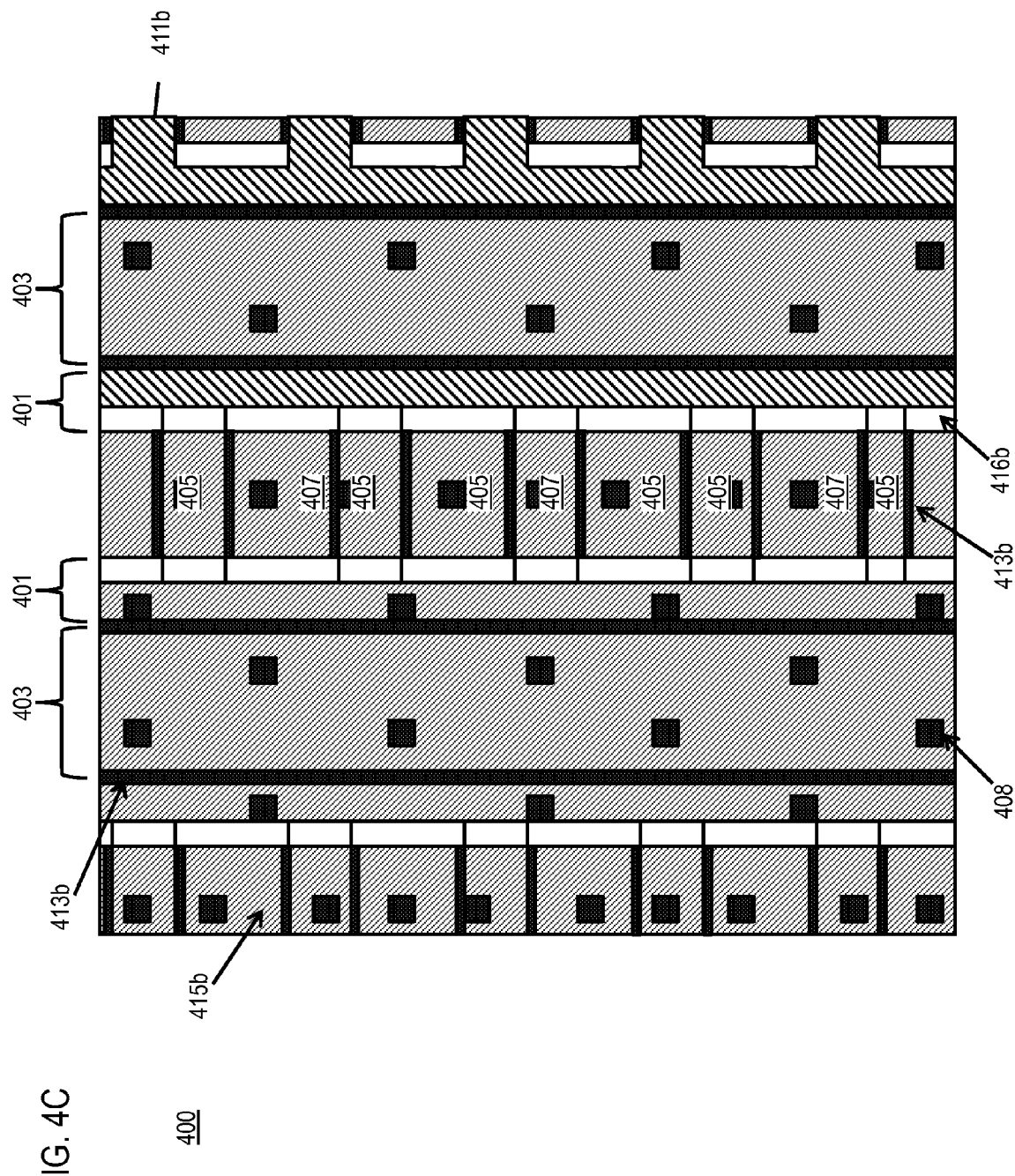

FIGS. 4A, 4B, and 4C include bitlines 401, bitline stubs 401a, $V_{CC}$ regions 403, wordlines 405, and $V_{SS}$ regions 407. FIGS. 4B and 4C additionally illustrate contacts 408. As shown, in FIG. 4A the features (e.g., 401a-407) are generated in an M1 layer 400 utilizing a double or triple exposure process (e.g., LELE, LELELE). $V_{SS}$ and bitline routing may be performed in the M2 layer (not shown) using $V_{SS}$ stubs (e.g. $V_{SS}$ regions 407) and bitline stubs (e.g., bitline stubs 401a) in the M1 layer.

FIG. 4B illustrates a first embodiment of generating the features of FIG. 4A utilizing a SIT (or SADP) process. Adverting to FIG. 4B, a mandrel layer 411a has first and second vertical portions positioned on an adjacent pair of $V_{CC}$ regions 403 and horizontal portions positioned on $V_{SS}$ regions 407 separating the first and second vertical portions. The SIT process results in spacers 413a being formed on outer edges of the mandrel layer. Additionally, FIG. 4B illustrates a keep mask 415a with openings indicating a block mask 416a having first and second vertical portions and horizontal portions separating each set of two of the wordlines 405 and one of the $V_{SS}$ regions 407 from another such set and from the bitlines 401. As such, the SIT process with the mandrel layer 411a, spacers 413a, and keep mask 415a result in the features of FIG. 4A except with the bitline routing being performed in the M1 layer (e.g., bitlines 401) rather than in the M2 layer.

FIG. 4C illustrates a second embodiment of generating the features of FIG. 4A utilizing a SIT (or SADP) process. Adverting to FIG. 4C, a mandrel layer 411b has first and second vertical portions positioned on an adjacent pair of bitlines 401 and horizontal portions positioned on either one of the $V_{SS}$ regions 407 separating two of the wordlines 405 or on one of the wordlines 405 separating another one of the wordlines 405 from one of the $V_{SS}$ regions 407. The SIT process results in spacers 413b being formed on outer edges of the mandrel layer. Additionally, FIG. 4B illustrates a keep mask 415b with openings indicating a block mask 416b adjacent to the first and second vertical portions of the mandrel layer 411b. As such, the SIT process with the mandrel layer 411b, spacers 413b, and keep mask 415b results in the features of FIG. 4A except with the bitline routing being performed in the M1 layer (e.g., bitlines 401).

The embodiments of the present disclosure can achieve several technical effects, including a generation of metal routes in devices utilizing SIT processes. The present disclosure enjoys industrial applicability in any of various types of highly integrated semiconductor devices, particularly in IC devices utilizing SIT technology and in technology nodes of 14 nm and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a hardmask on a substrate;
   forming a mandrel layer on the hardmask comprising:
   first and second vertical portions extending along a vertical direction and separated by a horizontal distance; and
   a plurality of horizontal portions extending in a horizontal direction, wherein each of the horizontal portions is positioned between the first and second vertical portions and at a different position along the vertical direction;
   forming a spacer layer on outer edges of the mandrel layer;
   providing first and second block layers on the hardmask extending along the vertical direction and positioned between the first and second vertical portions, the first and second block layers being separated from each other;
   etching the substrate, forming recesses, the first and second block layers preventing one or more portions of the substrate from being etched,
   wherein the horizontal portions span the horizontal distance;
   providing the first and second block layers on the substrate adjacent to the first and second vertical portions, respectively;
   providing a first bitline adjacent to the first block mask and separated from a region between the first and second block masks; and
   providing a second bitline adjacent to the second block mask and separated from a region between the first and second block masks.

2. The method according to claim 1, wherein the horizontal portions are separated from the each of the vertical portions and positioned between the first and second block masks, the method further comprising:
   providing the first bitline between the first vertical portion and the first block mask; and
   providing the second bitline between the second vertical portion and the second block mask.

3. The method according to claim 1 comprising:
   providing a plurality of wordlines between the first and second block masks; and
   providing a plurality of VSS regions between the first and second block masks, wherein one of the horizontal portions is positioned on one of the VSS regions separating two of the wordlines and/or one of the horizontal portions is positioned on one of the wordlines separating another one of the wordlines from one of the VSS regions.

4. The method according to claim 3 comprising providing a VCC region separated by the spacer layer on a side of each of the first and second vertical portions, the VCC regions being outside a region between the first and second portions.

5. The method according to claim 4, wherein the mandrel layer on the substrate further comprises:
   third and fourth vertical portions extending along the vertical direction and separated by the horizontal distance; and
   a plurality of second horizontal portions extending in the horizontal direction and spanning the horizontal distance, wherein each of the second horizontal portions is positioned between the third and fourth vertical portions and at a different position along the vertical direction.

6. The method according to claim 1, comprising:
   providing M1 or M2 routes for a SRAM bitcell in the recesses formed by the etching.

7. A method comprising:
   providing a hardmask on a substrate;
   forming a mandrel layer on the hardmask comprising:
   first and second vertical portions extending along a vertical direction; and a third vertical portion extending along the vertical direction being positioned between the first and second vertical portions and separated from the first and second vertical portions;

forming a spacer layer on outer edges of the mandrel layer;

providing a plurality of block layer portions extending in a horizontal direction and separated from the first and second vertical portions, wherein each of the block layer portions extends along an entire horizontal width of the third vertical portion and is at a different position along the vertical direction;

etching the substrate, the block layer portions preventing portions of the substrate layer from being etched; and providing first and second bitlines on the substrate, the first and second vertical portions being provided on the first and second bitlines, respectively.

8. The method according to claim 7 comprising providing a plurality of wordlines on the substrate, the third vertical portion being provided on the wordlines, each adjacent pair of the wordlines being separated by one of the block layer portions.

9. The method according to claim 8 comprising:
providing first and second VSS regions between the first and third vertical portions and between the second and third vertical portions, respectively; and
providing a VCC region separated by the spacer layer from a side of each of the first and second vertical portions, the VCC regions being outside a region between the first and second portions.

10. The method according to claim 7, wherein the mandrel layer further comprises: fourth and fifth vertical portions extending along the vertical direction; and a sixth vertical portion extending along the vertical direction being positioned between the fourth and fifth vertical portions and separated from the fourth and fifth vertical portions, the method further comprising:
providing a plurality of second block layer portions extending in the horizontal direction and separated from the fourth and fifth vertical portions, wherein each of the second block layer portions extends along an entire horizontal width of the sixth vertical portion and at a different position along the vertical direction.

11. A method comprising:
providing a hardmask on a substrate;
forming a mandrel layer on the hardmask comprising:
first and second vertical portions extending along a vertical direction; and
third and fourth vertical portions extending along the vertical direction being positioned between the first and second vertical portions and each being separated from the first and second vertical portions;

forming a spacer layer on outer edges of the mandrel layer; and providing a plurality of block layer portions extending in a horizontal direction and between the third and fourth vertical portions, wherein each of the block layer portions extends along an entire horizontal separation distance between spacers at outer edges of the third and fourth vertical portions and is at a different position along the vertical direction.

12. The method according to claim 11 further comprising etching the substrate, the block mask portions preventing portions of the substrate layer from being etched.

13. The method according to claim 12 comprising:
providing a first bitline between the first and third vertical portions; and
providing a second bitline between the second and fourth vertical portions.

14. The method according to claim 13 comprising providing a plurality of wordlines between the third and fourth vertical portions, each adjacent pair of the wordlines being separated by one of the block layer portions.

15. The method according to claim 14 comprising:
providing first and second VSS regions on the substrate, wherein the third and fourth vertical portions are provided on the first and second VSS regions, respectively; and
providing a VCC region on the spacer layer on a side of each of the first and second vertical portions, the VCC regions being outside a region between the first and second portions.

16. The method according to claim 15, wherein the mandrel layer further comprises: fifth and sixth vertical portions extending along the vertical direction; and seventh and eighth portions extending along the vertical direction being positioned between the fifth and sixth vertical portions and each being separated from the fifth and sixth vertical portions, the method further comprising:
a plurality of second block layer portions extending in the horizontal direction and between the seventh and eighth vertical portions, wherein each of the second block layer portions extends along an entire horizontal separation distance between the seventh and eighth vertical portions and is at a different position along the vertical direction.

* * * * *